United States Patent [19]
Gerhold

[11] Patent Number: 5,530,298
[45] Date of Patent: Jun. 25, 1996

[54] SOLID-STATE PULSE GENERATOR

[75] Inventor: Richard R. Gerhold, Houston, Tex.

[73] Assignee: Dresser Industries, Inc., Dallas, Tex.

[21] Appl. No.: 116,872

[22] Filed: Sep. 3, 1993

[51] Int. Cl.⁶ .................................................. H03K 5/15
[52] U.S. Cl. ........................ 307/106; 307/116; 327/100; 333/20
[58] Field of Search .................................... 327/100, 101, 327/102, 103, 113, 124, 164, 174, 181, 182, 183, 277, 281, 288; 326/34; 307/104, 106, 116; 331/107 R, 108 R; 333/20

[56] References Cited

U.S. PATENT DOCUMENTS

| | | | |
|---|---|---|---|
| 3,602,825 | 8/1971 | Senior | 327/179 |
| 3,820,090 | 6/1974 | Wiegand | 365/133 |
| 4,004,163 | 1/1977 | Spence | 327/290 |
| 4,542,301 | 9/1985 | Narabu | 327/288 |
| 4,965,711 | 10/1990 | Kamp | 327/124 |
| 5,004,159 | 4/1991 | Kistner | 239/337 |
| 5,010,568 | 4/1991 | Merriam et al. | 379/107 |

FOREIGN PATENT DOCUMENTS

| | | |
|---|---|---|
| 2506932 | 3/1982 | France . |
| 2552890 | 5/1977 | Germany . |
| 3932735 | 4/1991 | Germany . |
| 3941606 | 6/1991 | Germany . |
| 1507449 | 4/1978 | United Kingdom . |
| 2073428 | 10/1981 | United Kingdom . |

OTHER PUBLICATIONS

"Weigand Effect Sensors and Their Application in Manufacturing" Aug. 1, 1989, Joseph Pasqualucci Weigand Effect Sensors, Pub. date unknown.

*Primary Examiner*—William M. Shoop, Jr.
*Assistant Examiner*—Peter Ganjoo
*Attorney, Agent, or Firm*—Jones, Day, Reavis & Pogue

[57] ABSTRACT

A solid-state pulse generator for use in determining the output of a gas volume meter. A sensor detects a change in a magnetic field with rotation of a gas meter element and generates an electrical output pulse. A MOSFET switch having output terminals is coupled to the sensor for forming a closed circuit between the output terminals when the pulse is generated by the sensor thereby enabling a data collection circuit coupled to the MOSFET output terminals.

20 Claims, 3 Drawing Sheets

SOLID-STATE PULSE GENERATOR

FIELD OF THE INVENTION

The present invention relates in general to natural gas volume meters and specifically relates to a solid-state pulse generator coupled to a natural gas volume meter for generating output signals representing quantities of gas volume measured by the natural gas volume meter.

BACKGROUND OF THE INVENTION

Remote or automatic reading of the natural gas meter usually involves the accumulation of electrical pulses produced by a device placed on the gas meter that translates mechanical motion, usually rotation of a shaft, into electrical pulses. Each pulse represents a unit volume of gas. Reliable accumulation of gas volume usage demands reliable generation of electrical pulses by the device placed on the gas meter.

As stated, current technology predominately uses a magnet mounted on a shaft which, when moved or rotated, activates a magnetically sensitive reed relay which opens and closes an electrical circuit. The opening and closing of the circuit represents the pulse conditions that are accumulated by the remote or automatic reading equipment.

The switch action of a reed switch requires no electrical power to operate and only minimum electrical power to sense the operation thereof. This minimizes the electrical power requirements of the remote or automatic reading device and is very desirable since the remote or automatic reading equipment is often battery powered. The easy means of interface and the low power requirements of the magnet and reed switch have resulted in a proliferation of these devices implemented to provide electrical switch closure pulses which represent specific gas volume amounts that are subsequently accumulated by remote or automatic reading equipment.

Increasing natural gas prices and other demand for increased gas volume measurement accuracy have motivated a desire for smaller volumes of gas to be represented per pulse. This results in higher pulse repetition rates for the reed switch devices. Operating at higher repetition rates has reduced the operating lifetime of the reed switch components and reduced reliability of systems using the current reed switch technology.

The present invention overcomes the disadvantages of the prior art by using a magnetic sensor that generates an output signal without requiring electrical power. It is of a type disclosed in U.S. Pat. No. 3,820,090. The magnetic sensor is located close to a magnet that is mounted on the shaft of the gas meter. As the shaft and the magnet rotate, magnetic flux reversals cause the sensor to produce voltage pulses that are 20 microseconds long. These pulses would not be directly compatible with the input of existing remote or automatic meter reading equipment because they are too narrow. To interface the signal with existing remote or automatic meter reading equipment, the output from the sensor must be modified. The duration of the output signal must be increased significantly and the signal must be buffered to represent an opening and closing of the external circuit that connects the pulser to the remote or automatic meter reading equipment. Thus the present invention uses a circuit that consumes no quiescent power to perform the signal modification. Finally, a MOSFET device functions as a switch element to open and close the external circuit. No source of electrical power, other than the magnetic sensor, is required by the invention to do the signal modification.

Thus several aspects of the invention are distinctive from other attempts to solve the same problem. Critical to the application is a sensor that generates a voltage signal. Other attempts have used sensors that consume electrical power rather than generate it. Still other attempts use a sensor that generates power but the signal amplitude decreases as the shaft speed decreases. Since the application requires sensing shaft speed all the way to a stop, the present invention uses a sensor with an output that is consistent for all shaft speeds useful to the application. Further other attempts at solving the problems have used active devices in the circuit to modify the sensor output signal. These active components require electrical power to operate and would be unacceptable for the application disclosed herein. One prior art device as disclosed in a document entitled "Wiegand Effect Sensors and Their Application in Manufacturing" by Joseph Pasqualucci, dated Aug. 1, 1989, discloses such a device that uses a bipolar transistor. However, the bipolar transistor has a low input impedance that would prohibit the output pulse duration required for this application.

Thus it is a feature of the present invention to provide a solid-state pulser having a separate magnetic sensor, a circuit requiring no quiescent power to increase the duration of the output signal of the sensor and a first MOSFET output transistor acting as a switch and having a high input impedance to allow the increased duration of the active output signal.

It is another feature of the present invention to provide a gas meter solid-state pulse circuit with a magnetically sensitive device and circuit that will provide easy interface to existing equipment, require no operating electrical power and operate longer than existing prior art devices.

It is still another feature of the present invention to provide a sensor that generates a voltage signal instead of consuming electrical power.

It is also a feature of the present invention to provide a sensor that senses shaft speed all the way to a stop and that has an output that is consistent for all shaft speeds useful to the automatic meter reading equipment.

It is yet another feature of the present invention to provide one output closure pulse for each changing magnetic flux cycle applied to the magnetic sensor.

It is a further feature of the present invention to have a moving magnet which applies magnetic flux of one polarity on a magnetic sensor and then applies magnetic flux of the opposite polarity on the same sensor in the course of making a complete cycle.

It is still another feature of the present invention to have the magnet rotating such that its fastest rotational motion in a particular application does not result in magnetic flux reversals on the magnetic sensor more frequent than the minimum output switch closure duration required by the particular application.

It is also a feature of the present invention to have a magnetic sensor that generates a positive voltage pulse of 20 microseconds duration when exposed to magnetic flux of one polarity and a similar negative voltage pulse when exposed to magnetic flux of the opposite polarity.

It is another feature of the present invention to conduct the positive pulse, by means of a second enhancement MOSFET, to charge a capacitor and thus provide the positive voltage to the gate of the first enhancement MOSFET, used as an output switch, so as to turn on such a device for a time longer than 50 milliseconds.

It is yet another feature of the present invention to conduct the negative pulse of the magnetic sensor, by means of a second enhancement MOSFET, to the previously charged capacitor to cause the discharge of said charged capacitor so as to apply a negative voltage to the gate of the first enhancement MOSFET, which is used as an output switch, and thus turn off such a device.

It is still a further feature of the invention to connect the gate of the second enhancement MOSFET, used to conduct the negative pulse from the magnetic sensor, to the drain of the first enhancement MOSFET, used as an output switch, and thus to the positive output signal, so as to effect positive feedback on the operation of the solid-state pulser.

It is also a feature of the present invention through the use of positive feedback, to cause the turn off of the first enhancement MOSFET, which is used as an output switch, to occur quickly and without oscillations.

SUMMARY OF THE INVENTION

Thus the present invention relates to a solid-state pulse generator comprising a sensor for detecting a change in the magnetic field and generating an electrical output pulse without requiring a separate electrical power source, and a first MOSFET switch coupled to the sensor for forming a closed circuit with the pulses generated by the sensor and enabling a data collection circuit coupled thereto.

The invention also comprises a pulse control circuit coupled between the sensor and the first MOSFET switch to receive the electrical output pulse from the sensor and increase the duration thereof sufficient to allow use thereof by automatic meter reading equipment. The sensor used herein has no moving parts and the pulse control circuit is a solid-state circuit capable of receiving a pulse having a 20 microsecond pulse width and generating an output pulse with a length greater than 50 milliseconds. The first MOSFET switch used in the present invention is an enhancement MOSFET which operates solely with the sensor generated pulse so as to require no external power source.

The invention can be used anyplace where a magnet is mechanically moved so as to cause a magnetic reed switch to open and close an electric circuit, and such opening and closing is an input signal to associated electrical equipment, such that it represents specific physical events associated with the motion of the magnet. Further, in place of a magnet and sensor, a pulse transformer can be used to provide the input pulses.

BRIEF DESCRIPTION OF THE DRAWINGS

These and other features of the present invention will be more fully disclosed when taken in conjunction with the following DETAILED DESCRIPTION OF THE DRAWINGS in which like numerals represent like elements and in which.

DETAILED DESCRIPTION OF THE DRAWINGS

The terminology "solid-state" has some ambiguity. The definition that is generally accepted by the electrical/electronic engineering community for solid-state is—a device that is made from semiconducting materials and operates by means of the quantum mechanic principles associated with the transport of charge in such materials—. A circuit that consists mainly of such devices might also be considered a solid-state circuit.

A widely used, but less accurate, definition for solid-state might be—electrical devices and circuits that do not have moving parts—. The sensor involved with this invention has no moving parts, but is not made from semiconducting materials. The sensor is not referred to herein as solid-state, according to the first definition above. The entire invention, which does consist mainly of semiconducting devices and is also differentiated from currently practiced art, i.e. electromechanical reed switches, by the absence of moving parts, will hereafter be described as a solid-state pulser.

Figure 1:
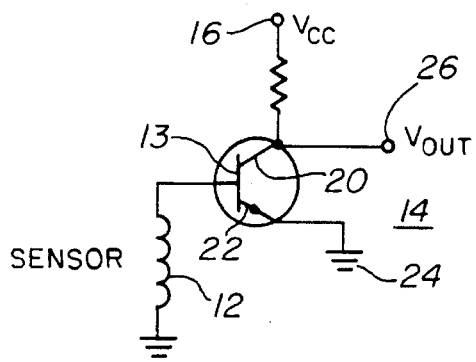
FIG. 1 is a schematic diagram of a prior art pulse generating circuit.
Figure 2A:
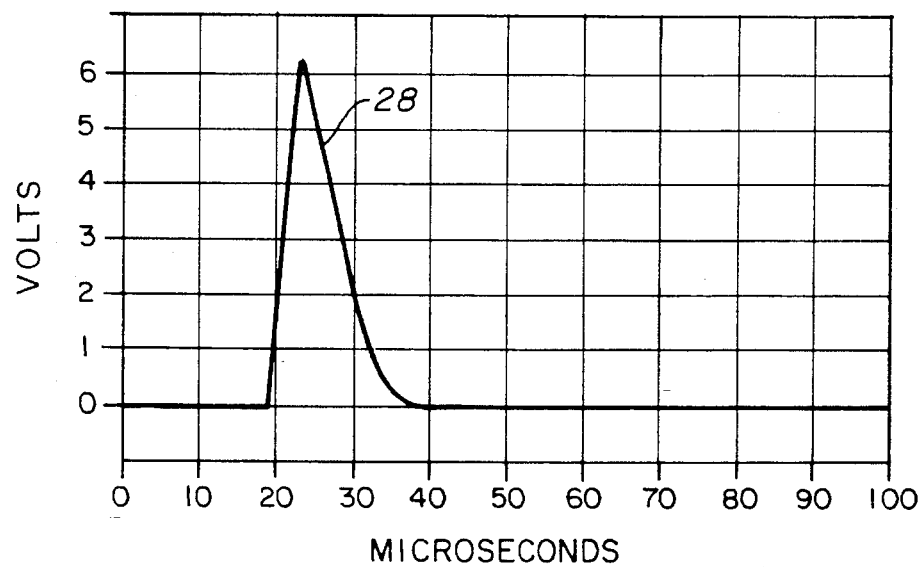
FIG. 2A is a graph of a typical positive pulse generated by the sensor of FIG. 1.
Figure 2B:
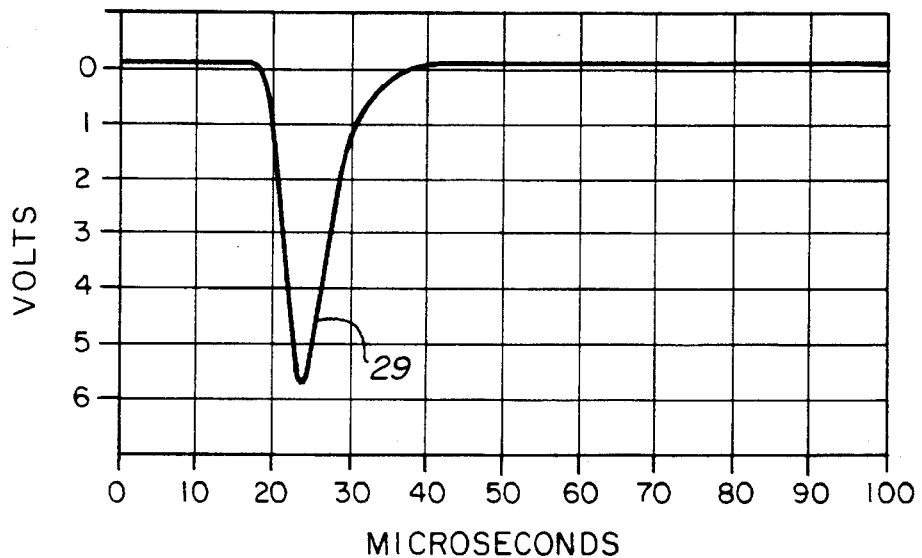
FIG. 2B is a graph of a typical negative pulse generated by the sensor of FIG. 1 when the magnetic flux is reversed on the sensor of FIG. 1.

FIG. 1 is a circuit diagram of a prior pulse generator utilizing a sensor 12 of the type used in the present invention. The sensor is available in the prior art and is produced by cold working 0.01 inch diameter Vicalloy wire. Vicalloy, a ferromagnetic material, consists of iron, cobalt and vanadium. The wire is formed such that it generates a gradient of higher coercivity at the work-hardened surface to a lower coercivity at the relatively soft center. The coercivity levels are identified when the wire is sectioned through the diameter as two distinct areas, an outer "shell" and an inner "core". Magnetic switching occurs in the shell and core when the wire is in the presence of longitudinal magnetic field cycling. The resultant hysteresis loop contains large discontinuous jumps known as Barkhausen Discontinuities which occur due to shell and core polarity switching. The wire induces a voltage across the pick-up coil approximately 20 microseconds in duration as illustrated in FIG. 2. When the magnetic field is reversed, a negative voltage is induced from the pickup coil approximately 20 microseconds in duration as is illustrated in FIG. 2B. Induced voltage amplitude is dependent on excitation field strength and orientation. The wire used in forming the sensor is known in the prior art as the "Wiegand Effect Wire". The pulse as shown by waveform 28 in FIG. 2A generated by sensor 12 is coupled to the base 13 of the bipolar transistor 14 which may be a 2N2222 or equivalent. A voltage source 16 is coupled through load resistor 18 to the collector 20 of transistor 14 and the emitter 22 of transistor 14 is coupled to ground 24. The output from collector 20 is coupled to terminal 26.

Figure 3:
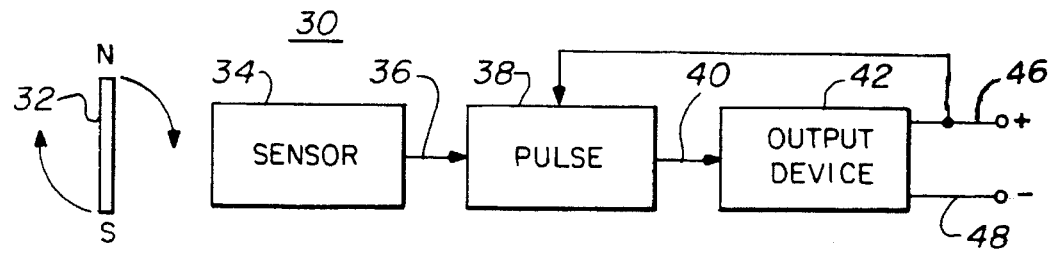
FIG. 3 is a schematic block diagram of the present invention.

FIG. 3 is a block diagram of the solid-state pulser 30 of the present invention. Magnet 32 is coupled to the shaft or rotor of the gas meter (not shown). As the shaft and magnet 32 rotate, the moving magnet applies magnetic flux of one polarity to sensor 34 and then applies magnetic flux of the opposite polarity to the same sensor 34 in the course of making a complete cycle. The magnetic sensor 34 is located close to the magnet 32 and the magnetic flux reversals cause the sensor 34 to produce the voltage pulses as illustrated in FIG. 2A and FIG. 2B that are 20 microseconds in duration. One output closure pulse is provided for each changing magnetic flux cycle applied to the magnetic sensor 34. The magnet 32 rotates such that the fastest rotational motion in a particular application does not result in magnetic flux reversals on the magnetic sensor more frequent than the minimum output switch closure duration required by the particular application.

To interface to existing remote or automatic meter reading equipment, the output from the sensor 34 must be modified. The duration of the output signal on line 36 must be increased significantly and the pulser circuit 30 must be buffered to represent an opening and a closing of the external circuit that connects the pulser 30 to the remote or automatic meter reading equipment 58 illustrated in FIG. 5.

In the present invention, components that do not require a separate power source to operate form a pulse control circuit 38. This circuit serves to modify the output signal on line 36 from the magnetic sensor 34. The modified signal on line 40 is coupled to an output device 44 which functions as a switch element to open and close the external circuit. No source of electrical power, other than the sensor, is required by the circuit 38 to do the signal modification.

Figure 6:
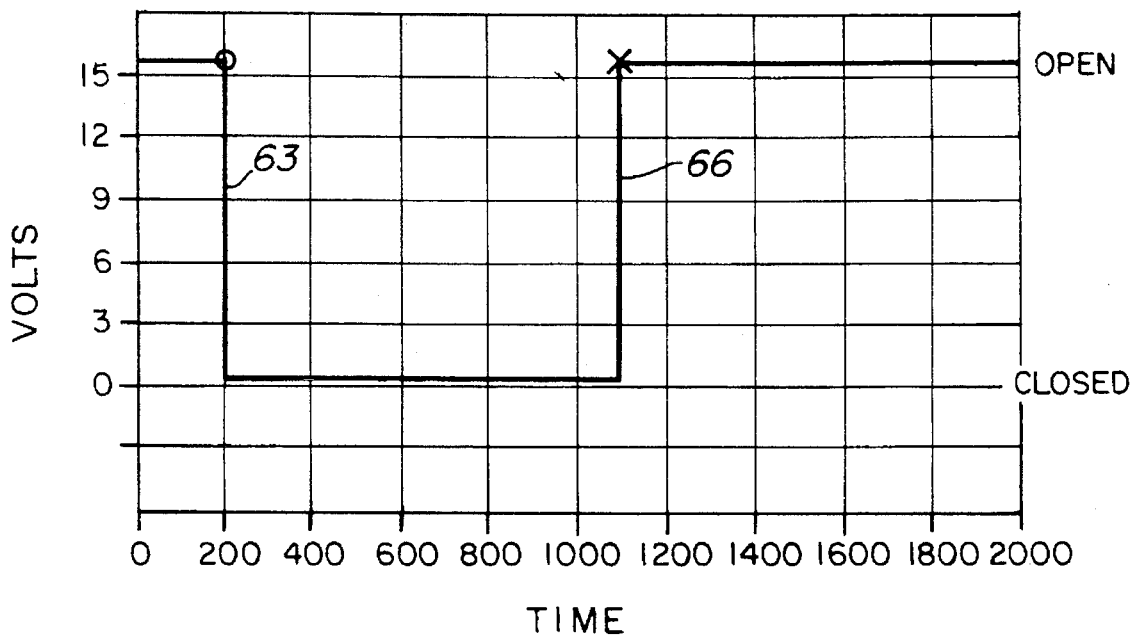
FIG. 6 is a graph of the output pulse of the solid-state pulser showing the switch closure pulse with a duration of about 880 milliseconds and occurring with a power repetition rate of one pulse per 10 seconds.
Figure 7:
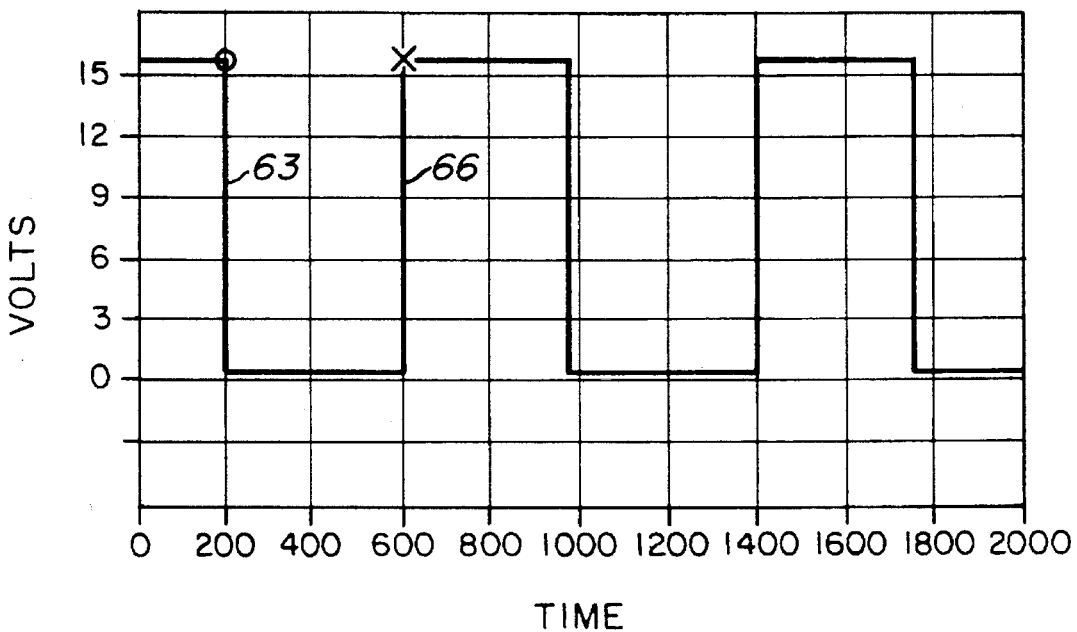
FIG. 7 is a graph of the output pulse of the solid-state pulser showing the switch closure pulse with a duration of about 400 milliseconds and occurring with a pulse repetition rate of about one pulse per 800 milliseconds.

Several aspects of the invention are distinctive from other attempts to solve the same problem. Critical to the application is a sensor 34 that generates a voltage signal on line 36. Other attempts have used sensors that consume electrical power rather than generating it. This invention uses a sensor 34 that generates an output signal without requiring a separate source of electrical power. Some other attempts have been made to use a sensor that generates power but whose signal amplitude decreases as shaft speed decreases. Since the application requires sensing shaft speed all the way to a stop, the present invention uses a sensor 34 with an output on line 36 that is consistent for all shaft speeds useful to the application disclosed herein. As stated, other attempts at solving the problem have used active devices in the circuit to modify the sensor output signal. These active components require electrical power to operate and would be unacceptable for the application. The prior art example in FIG. 1 does not increase the duration of the active output signal nor does it make use of the negative pulses produced by the sensor. It is distinctive that the present invention does. The circuit 38 receives the signal on line 36 from sensor 34, and increases the duration of the pulse to greater than 50 milliseconds as can be seen in FIGS. 6 and 7. The pulse of increased duration is coupled on line 40 to an output device 42 which may be a first MOSFET 44 (see FIG. 4). The output of the MOSFET 44 appears on line 46 and is coupled to a collection device 58 (see FIG. 5). The output line 48 serves as the signal return path between the collection device 58 and the solid-state pulser 30. Thus as can be seen in FIG. 3, since the sensor 34 generates a voltage signal of adequate strength to generate the pulse control circuit 38 and the MOSFET 44, the pulse forming device of FIG. 3 can be used in locations where there is no external power available.

Figure 4:
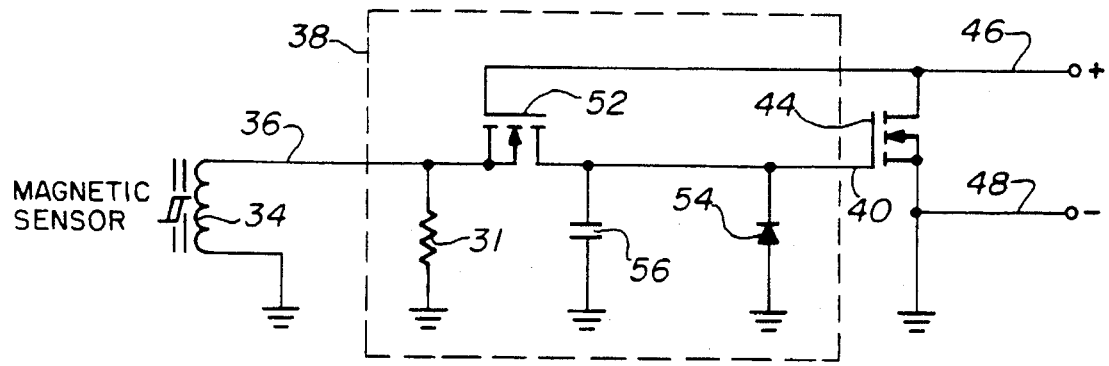
FIG. 4 is an electrical schematic diagram of the present invention.

FIG. 4 is an electrical schematic diagram of the solid-state pulser shown in FIG. 3. The magnetic sensor 34 is shown in FIG. 4 as a coil. The pulse control circuit 38 comprises an input load resistor 31 across which the signal from the magnetic sensor is developed. A second MOSFET 52 includes, as most MOSFETs do, an internal diode between the drain and source terminals, such that conduction will occur when the source is positive with respect to the drain. This internal diode conducts the positive output pulse 28 generated by the magnetic sensor 34 as the magnet 32 rotates. The positive output pulse thus conducted serves to charge capacitor 56.

Capacitor 56, thus charged, positively biases the gate of first MOSFET 44 turning it ON. MOSFET 44 simply acts as a switch and with the gate made positive with respect to the source, the switch is in the ON or closed condition thus coupling the output terminals on lines 46 and 48 to each other. Thus as the magnet 32 in FIG. 3 is rotated, a negative pulse will be generated by magnetic sensor 34 which may represent a predetermined volume of gas measured by the gas meter. The negative pulse, shown in FIG. 2B, is applied to the gate of the second MOSFET 44 and turns it OFF, the open condition.

The gate of the second MOSFET 52 is connected to the positive output terminal 46 of the first MOSFET 44. This affects positive feedback by allowing the rising voltage on output 46 at the end of the output pulse (66 of FIG. 6) to increase drain source conduction on the second MOSFET 52 thereby lowering the voltage at the gate of the second MOSFET 44. This cancels the tendency of the second MOSFET 44 to oscillate when the magnet rotation is very slow and temperatures are cold. At all temperatures this positive feedback results in a faster rise time at the end of the switch closure output pulse.

The diode 54 serves the function of clamping, at the gate of the first MOSFET 44, the negative "reset" pulse from the magnetic sensor 34 so that it will not interfere with the next positive "set" pulse from the magnetic sensor 34 when the magnet is being turned quickly.

Figure 5:
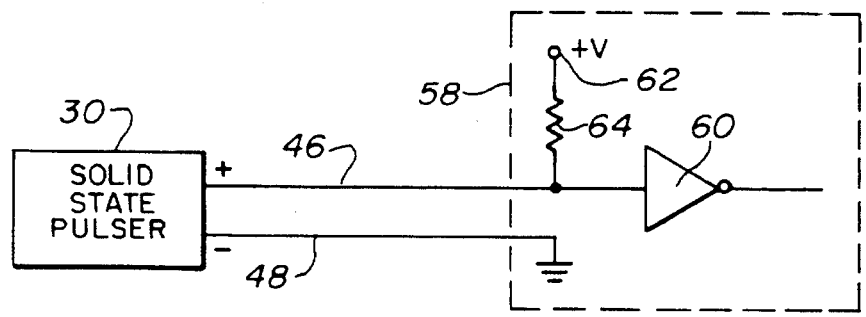
FIG. 5 is a block diagram illustrating the connections of the output of the present invention to a data collection circuit that exists in the art.

FIG. 5 is a diagram illustrating the solid-state pulser 30 as a block with its outputs on line 46 and 48 being coupled to a remotely located typical data collection device 58. An inverter 60 is biased by a voltage source 62 through resistor 64. The closing of the first MOSFET switch 44 in the solid-state pulser 30 provides a pulse through the inverter 60 to the data collection equipment, well known in the art and not shown in detail, for tabulation and measurement purposes.

As stated earlier, FIG. 6 illustrates the 20 microsecond pulse in FIG. 2 being increased in duration to about 880 milliseconds by the circuit 38 shown in FIG. 4. The voltage source 62 shown in FIG. 5 is 16 volts for the example of FIG. 5 and FIG. 6. When the positive pulse 28 from the magnetic sensor first occurs, it passes through the internal diode of MOSFET 52 and charges capacitor 56 thus turning ON MOSFET 44 and producing the output on line 46 shown in FIG. 6. At the beginning of the output pulse as shown at 63, the voltage drops suddenly to zero when the MOSFET 44 turns ON and remains at this condition as charge leaks off the capacitor 56. When enough charge has left capacitor 56 to allow the output voltage to begin to rise, the positive feedback provided by coupling the output to the gate of MOSFET 52 quickens the turn off of the output as shown at 66 of FIG. 6.

FIG. 6 is an example where the rotation of magnet 32 is slow and the output pulse completes before the magnetic sensor generates a negative pulse. In FIG. 7 the rotation of the magnet 32 is quicker, with a positive pulse from the magnetic sensor occurring about every 800 milliseconds. Note that the output pulse duration has been shorten to about half of that time because the negative pulse from the magnetic sensor has occurred and is passed to capacitor 56 by the MOSFET 52, and effects a rapid turn off of the output pulse as shown at 66 of FIG. 7.

Although the first embodiment is to provide solid-state switch closure in response to the motion of a magnet, a second embodiment of this concept is also possible. This alternate form of the invention provides solid-state switch closure in response to a driving output from an electronic circuit. The second embodiment allows for electrical isolation between input and output, is extremely low powered, and is inexpensive compared to traditional approaches to do the same thing. Whereas the first embodiment is similar to a magnetic reed switch, the second embodiment is analogous to a relay.

Figure 8:
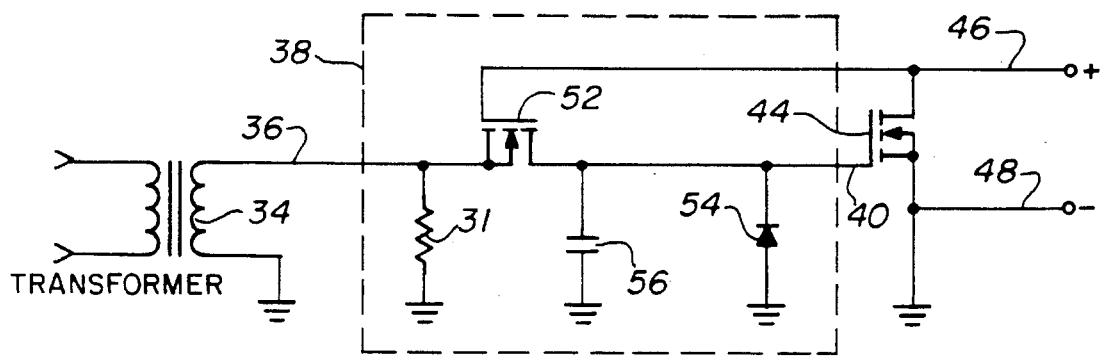
FIG. 8 is an electrical schematic diagram of the novel invention having a pulse transformer as the input signal source.

The second embodiment of the invention is shown in FIG. 8 where the sensor is replaced by a tiny pulse transformer 34. The input of the pulse transformer is then driven from an output of an electronic circuit. When this drive is of one polarity for about 30 microseconds the solid-state switch 44 is closed for a much longer duration, approximately 30 milliseconds. If successive drive pulses of the same polarity are applied, then the switch 44 output can continue to remain closed longer than 30 milliseconds. The switch 44 in the closed state can be opened at anytime by a 30 microsecond drive pulse of the opposite polarity. In this fashion, switch closure can be made to any desired duration.

Thus, there has been disclosed a solid-state pulser circuit which includes a magnetic sensor, a circuit for increasing the duration of the positive pulses produced by the magnetic sensor and at least one MOSFET output transistor. The magnetic sensor is located close to a magnet that is mounted on the shaft of the gas meter. As the shaft and magnet rotate, magnetic flux reversals cause the sensor to produce 20 microsecond long voltage pulses. These pulses would not be directly compatible in the input of existing remote or automatic meter reading equipment.

To interface to existing remote or automatic meter reading equipment, the output from the sensor must be modified. The duration of the output signal must be increased significantly and the signal must be buffered to represent an opening and closing of the external circuit that connects the pulser to the remote or automatic meter reading equipment. In the invention, components that do not require a separate power source are used to perform the signal modification. A MOSFET device functions as a switch element to open and close the external circuit. No electrical power is required by this invention to do the signal modification. The present application utilizes a sensor that senses shaft speed from full speed to no rotation. Thus the sensor has an output that is consistent for all shaft speeds useful to this application.

While the invention has been described in connection with a preferred embodiment, it is not intended to limit the scope of the invention to the particular form set forth, but, on the contrary, it is intended to cover such alternatives, modifications, and equivalents as may be included within the spirit and scope of the invention as defined by the appended claims.

I claim:

1. A solid-state pulse generator for enabling a data collection circuit and including:
   a sensor for detecting a change in a magnetic field and sequentially generating positive and negative electrical output signals;
   a first controlled switch coupled to the sensor and having output terminals for forming a closed circuit between the output terminals only when receiving a specific one of the positive and negative signals generated by the sensor, the closed circuit between the output terminals enabling the data collection circuit coupled thereto;
   a second controlled switch coupled between the sensor and the first controlled switch; and
   a voltage feedback circuit coupled from said first controlled switch to said second controlled switch, one or both of said voltage feedback and the other one of said sensor signals being used to increase the speed of disabling the data collection circuit.

2. A solid-state pulse generator as in claim 1 including a pulse control circuit coupled between the sensor and the first controlled switch and including said second controlled switch.

3. A solid-state pulse generator as in claim 2 wherein the first controlled switch is an enhancement MOSFET.

4. A solid-state pulse generator as in claim 3 wherein the pulse control circuit includes:
   a load resistor coupled in parallel with the sensor;
   a second MOSFET as said second controlled switch, said second MOSFET switch being coupled to the junction of the sensor and the load resistor for passing pulses from the sensor to the first MOSFET switch;
   a capacitor coupled between the second MOSFET switch and the first MOSFET switch and ground such that the capacitor is charged by a pulse applied thereto by the second MOSFET switch; and
   the gate of the first MOSFET switch being coupled to the capacitor such that when the capacitor charges, the first MOSFET switch is turned ON.

5. A solid-state pulse generator as a claim 4 wherein:
   said second MOSFET switch conducts both said positive and negative pulses generated by said sensor, said positive pulse charging said capacitor to turn said first MOSFET switch ON and said negative pulse discharging said capacitor to turn said first MOSFET switch OFF.

6. A solid-state pulse generator as in claim 5 wherein said sensor generates said positive and negative pulses in response to a rotating magnet.

7. A solid-state pulse generator as in claim 6 further including a positive feedback signal coupled from an output terminal of the first MOSFET switch to the gate of the second MOSFET switch to forward bias said second MOSFET switch and cause a sharp turn-off of the first MOSFET switch by rapidly discharging the capacitor through the second MOSFET switch at whatever speed said magnet is rotating.

8. A solid-state pulse generator as in claim 3 wherein the first MOSFET switch operates solely with the sensor generated pulses so as to require no external power source coupled to the switch.

9. A solid-state pulse generator as in claim 2 wherein the pulse control circuit is a solid-state circuit capable of receiving a pulse having a 20 microsecond pulse width and generating an output pulse with a length greater than 50 milliseconds.

10. A solid-state pulse generator as in claim 1 wherein the sensor has no moving parts.

11. A solid-state pulse generator as in claim 10 wherein the sensor is capable of generating bipolar, 20 microsecond, output pulses.

12. A solid-state pulse generator as in claim 1 where the sensor is a pulse transformer for receiving an input pulse and generating an output pulse.

13. A method of generating pulses for a data collection circuit, the pulses representing a gas volume meter output, the method comprising the steps of:

detecting a change in a magnetic field created by rotation of a magnet in response to a gas flow in the gas meter with a sensor and sequentially generating positive and negative electrical output pulses;

coupling a specific one of the output pulses to a first controlled switch having output terminals for forming a closed circuit between the output terminals when the specific one of the pulses is generated for enabling a data collection circuit coupled between the output terminals;

coupling a second controlled switch between said sensor and said first controlled switch;

coupling a voltage feedback circuit from said first controlled switch to said second controlled switch; and using one or both of said voltage feedback and the other one of said sensor signals to forward bias said second controlled switch and increase the speed of disabling the data collection circuit.

14. A method as in claim 13 further comprising the step of coupling a pulse control circuit, including a second controlled switch, between the sensor and the first controlled switch to increase the time duration of the output pulse to at least 50 milliseconds.

15. A method as in claim 14 wherein the step of generating an electrical output pulse further comprises the step of generating bipolar, 20 microsecond, output pulses with the sensor.

16. A method as in claim 15 further including the steps of:

using a pulse transformer on the sensor;

coupling the input of the pulse transformer to an electrical circuit; and coupling the output of the pulse transformer to the pulse control circuit.

17. A method as in claim 15 further including the steps of:

using a coil as the sensor; and generating a pulse in the coil by a rotating magnet.

18. A method as in claim 13 further including the steps of:

using a first MOSFET as said first controlled switch; and using a second MOSFET as said second controlled switch.

19. A method as in claim 18 further including the steps of:

establishing a ground potential;

coupling a capacitor between said first and second MOSFETs and said ground potential;

charging said capacitor with said positive sensor pulse through said second MOSFET to cause said first MOSFET to conduct; and discharging said capacitor with said negative sensor pulse through said second MOSFET to cause said first MOSFET to cease conduction.

20. A method as in claim 19 further including the step of coupling a positive feedback signal from an output terminal of said first MOSFET to the gate of said second MOSFET such that either or both a negative sensor pulse or said positive feedback signal will forward bias said second MOSFET and cause a sharp turn-off of the first MOSFET by rapidly discharging said capacitor through the second MOSFET.

* * * * *